US009171735B2

(12) United States Patent
Mehta et al.

(10) Patent No.: US 9,171,735 B2
(45) Date of Patent: Oct. 27, 2015

(54) METHOD FOR FABRICATING A SEMICONDUCTOR INTEGRATED CIRCUIT WITH A LITHO-ETCH, LITHO-ETCH PROCESS FOR ETCHING TRENCHES

(71) Applicant: GLOBALFOUNDRIES, Inc., Grand Cayman, KY (US)

(72) Inventors: Sohan Mehta, Saratoga Springs, NY (US); Norman Chen, Poughkeepsie, NY (US); Yuyang Sun, Wappingers Falls, NY (US); Matthew Herrick, Mechanicville, NY (US); Shyam Pal, Clifton Park, NY (US); Jeong Soo Kim, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 209 days.

(21) Appl. No.: 13/767,993

(22) Filed: Feb. 15, 2013

(65) Prior Publication Data
US 2014/0235055 A1 Aug. 21, 2014

(51) Int. Cl.
*H01L 21/308* (2006.01)
*G03F 7/00* (2006.01)
(52) U.S. Cl.
CPC ............ *H01L 21/308* (2013.01); *G03F 7/0035* (2013.01)
(58) Field of Classification Search
CPC .... H01L 21/308; G03F 7/0035; G03F 7/0392
USPC .................. 438/694; 257/E21.546
See application file for complete search history.

(56) References Cited

U.S. PATENT DOCUMENTS

2008/0194109 A1* 8/2008 Ishibashi et al. ............... 438/703

OTHER PUBLICATIONS

Sungkoo Lee et al. (Advances in Resist Technology and Processing XXIII, Proc. of SPIE vol. 6153, 61531K (pp. 61531K-1 to 61531K-7), (2006) ).*

* cited by examiner

*Primary Examiner* — Duy Deo
*Assistant Examiner* — Mahmoud Dahimene
(74) *Attorney, Agent, or Firm* — Ingrassia Fisher & Lorenz, P.C.

(57) ABSTRACT

Methods are provided for fabricating semiconductor integrated circuits including isolated trench features. In one embodiment, a method includes providing a semiconductor substrate with an overlying process layer. A trench pattern to be etched into the process layer is determined and that trench pattern is decomposed into first and second patterns, the second pattern including an isolated trench. First and second lithographic masks are formed to implement the first and second patterns, the second mask implementing the second pattern, the isolated trench, and a plurality of density balancer patterns symmetrically positioned with respect to the isolated trench. A first resist layer is patterned with the first lithographic mask and the process layer is etched with the first resist layer. A second resist layer is patterned with the second lithographic mask and the process layer is etched with the second resist layer to implement the required trench pattern in the process layer.

17 Claims, 3 Drawing Sheets

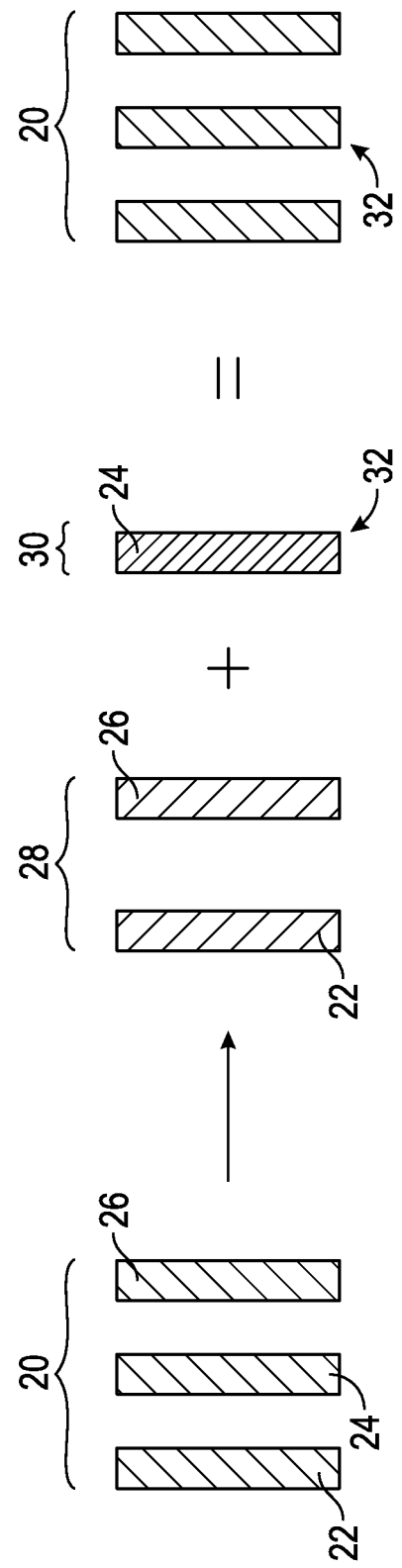

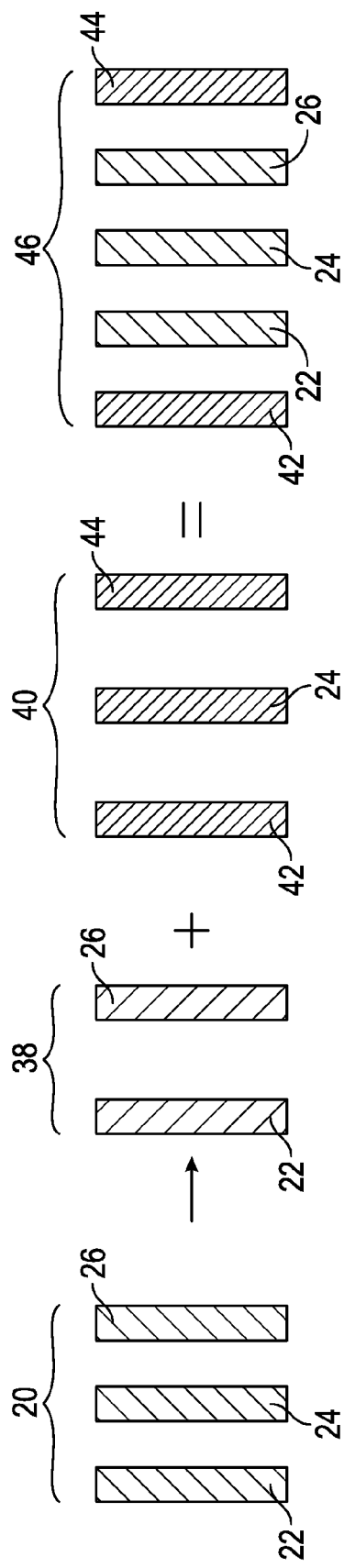
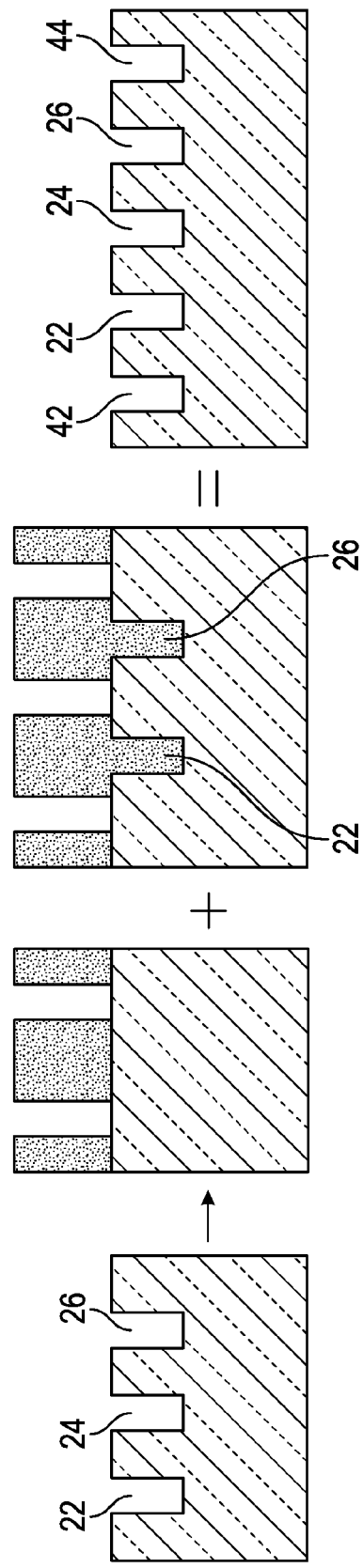
FIG. 2A
FIG. 2B

METHOD FOR FABRICATING A SEMICONDUCTOR INTEGRATED CIRCUIT WITH A LITHO-ETCH, LITHO-ETCH PROCESS FOR ETCHING TRENCHES

TECHNICAL FIELD

The present disclosure generally relates to methods for fabricating semiconductor integrated circuits, and more particularly relates to methods for fabricating semiconductor integrated circuits with a litho-etch, litho-etch process for etching trenches.

BACKGROUND

Semiconductor integrated circuits (ICs) are fabricated with a large number of interconnected components such as transistors and the like. As ICs become larger and more complex there is a continuing trend toward reducing the feature size of the components. As the minimum feature size, that is the minimum width of a line or space, continues to decrease, it becomes more and more difficult to reliably produce the ICs with an acceptably high yield.

ICs are fabricated by sequentially patterning layers of insulators, semiconductor materials, conductors and the like. The patterning is accomplished by lithographic and etch processes that reproduce a mask image on the layer to be patterned. As the feature size has decreased with each succeeding generation of ICs, the lithography processes have implemented changes to reliably reproduce the smaller features. At a feature size of about 40 nanometers (nm) or less, however, the present techniques have reached a point at which certain features, especially isolated trenches, cannot be reliably resolved with state-of-the-art processes.

Accordingly, it is desirable to provide methods for fabricating integrated circuits using optical lithography techniques. In addition, it is desirable to provide methods for fabricating integrated circuits using a litho-etch, litho-etch technique for etching trenches as part of the integrated circuit. Furthermore, other desirable features and characteristics of the present disclosure will become apparent from the subsequent detailed description and the appended claims, taken in conjunction with the accompanying drawings and the foregoing technical field and background.

BRIEF SUMMARY

Methods are provided for fabricating semiconductor integrated circuits including isolated trench features. In one embodiment, a method includes providing a semiconductor substrate with an overlying process layer. A trench pattern to be etched into the process layer is determined and that trench pattern is decomposed into first and second patterns, the second pattern including an isolated trench. First and second lithographic masks are formed to implement the first and second patterns, the second mask implementing the second pattern, the isolated trench, and a plurality of density balancer patterns symmetrically positioned with respect to the isolated trench. A first resist layer is patterned with the first lithographic mask and the process layer is etched using the first patterned resist layer as an etch mask. A second resist layer is patterned with the second lithographic mask and the process layer is etched using the second patterned resist layer as an etch mask to implement the required trench pattern in the process layer.

In accordance with a further method, an integrated circuit is fabricated by providing a semiconductor substrate with an overlying process layer and determining a trench pattern to be etched into the process layer, the trench pattern including an isolated trench. A lithographic mask is formed that implements the trench pattern and that further includes first and second density balancer patterns symmetrically positioned with respect to the isolated trench. A resist layer is applied overlying the process layer and is patterned with the lithographic mask. The process layer is etched using the patterned resist layer as an etch mask.

In accordance with yet another embodiment, an integrated circuit is fabricated by providing a process layer overlying a semiconductor substrate and determining a trench pattern to be etched into the process layer as required for the semiconductor integrated circuit being fabricated. The trench pattern is decomposed into a first pattern of lithographically printable features and a second pattern of lithographically unprintable features including an isolated trench. The lithographically unprintable features are converted to lithographically printable features by adding density balancer patterns to the second pattern in spaced apart symmetric relationship to the isolated trench to form a converted second pattern. The first pattern and the converted second pattern are etched into the process layer.

BRIEF DESCRIPTION OF THE DRAWINGS

The present disclosure will hereinafter be described in conjunction with the following drawing figures, wherein like numerals denote like elements, and wherein:

FIG. 1 schematically illustrates a problem in the fabrication of semiconductor integrated circuits (ICs) that is solved by the methods provided herein; and FIGS. 2A-4 schematically illustrate methods, in accordance with various embodiments, to overcome the shortcomings of the prior art processes, as described above, in the fabrication of semiconductor integrated circuits.

DETAILED DESCRIPTION

Figure 3:
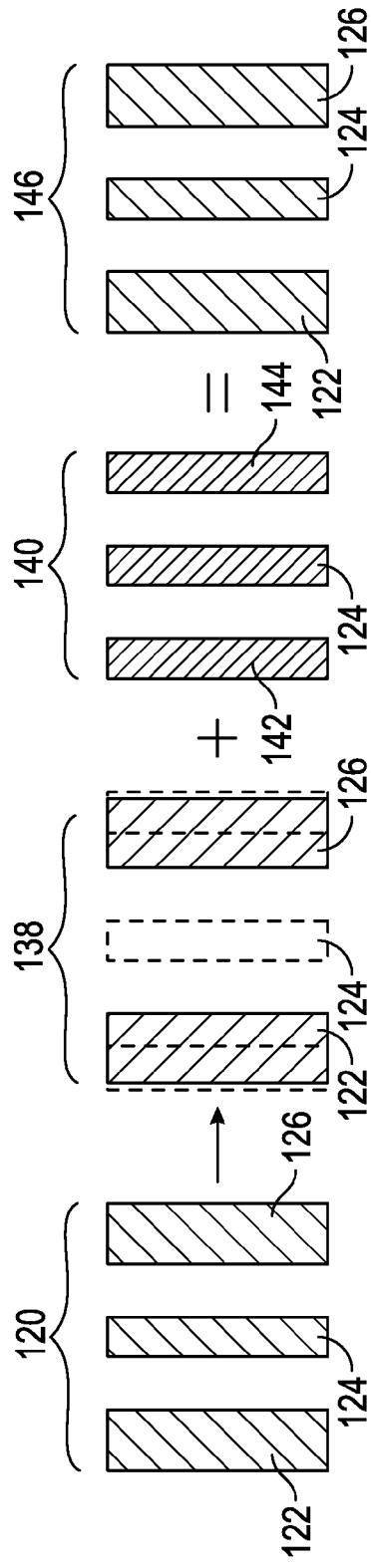

The following detailed description is merely exemplary in nature and is not intended to limit the disclosure or the application and uses of the disclosed processes. Furthermore, there is no intention to be bound by any expressed or implied theory presented in the preceding technical field, background, brief summary or the following detailed description. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components or features shown in the illustrations may be representative of multiple components.

Those of skill in the art will understand that the fabrication of an IC requires the patterning of a large number of sequentially grown or deposited layers of insulators, metals, semiconductor material, and the like, hereinafter referred to generically as a process layer. A process layer is patterned by applying a photosensitive layer (photoresist) overlying the process layer that is to be etched. The photoresist is selectively exposed by radiation that passes through a mask or reticle that contains the pattern that is to be replicated on the process layer. The mask is a transparent plate and the pattern on the mask is implemented with an opaque material such as a layer of chrome. The radiation that passes through the transparent portions of the mask impinges on the photoresist and cause a chemical/physical change in the photoresist material. A developer is applied to the exposed photoresist layer and, in conventional technology, either the exposed areas (positive tone resist) or the unexposed areas (negative tone resist) are removed, leaving a layer of patterned resist material on the process layer. The layer of patterned resist material is then used as an etch mask to etch the desired pattern into the underlying process layer. This simplified explanation ignores the well-known adhesion material layers, antireflection layers, hard mask layers, and the like that are often used.

FIG. 1 schematically illustrates a problem in the fabrication of semiconductor integrated circuits (ICs) that is solved by the methods provided herein. Pattern 20 on the left of the FIGURE represents a pattern that is to be etched into a process layer. Pattern 20, in this illustration, includes three trenches 22, 24, and 26. If the feature size and/or feature pitch are too small, it is not possible to directly replicate this pattern reliably in the process layer. For example, if each of the trenches has a width of 32 nm and the pitch is 64 nm (32 nm line/space), it may be difficult to reliably reproduce the desired pattern 20. In such cases, one approach to achieving pattern 20 has been to use a double patterning technique. In one such double patterning technique, pattern 20 is decomposed into two patterns represented in FIG. 1 by patterns 28 and 30. Pattern 28 includes two trenches 22 and 26 having a pitch of 128 nm (32 nm line and 96 nm space). Pattern 30 includes a single isolated trench 24 having a width of 32 nm. Lithographic masks are generated that implement the two patterns 28 and 30, respectively. In one double patterning technique known as litho-etch, litho-etch (LELE) a first layer of photoresist material is applied overlying the process layer, exposed (in this example with the mask that implements pattern 28) and developed, and the resulting patterned layer of photoresist is used as an etch mask to etch pattern 28 into the underlying process layer. The first layer of photoresist material is then removed and a second layer of photoresist material is applied overlying the process layer. The second layer of photoresist is exposed (in this example with the mask that implements pattern 30) and developed, and the resulting patterned layer of photoresist is used as an etch mask to etch pattern 30 into the underlying process layer. The two etch steps ideally achieve the desired pattern 20 etched into the process layer. Unfortunately, even using the state-of-the-art 193i photoresist scanner systems, isolated trenches such as the isolated trench in pattern 30 cannot be effectively and reliably printed at trench widths below about 40 nm. Small isolated trenches as indicted by arrows 32 cannot be printed reliably due to poor image contrast and process window. At such feature sizes, lithography techniques such as the use of either sub-resolution assist features or printed resolution features have been applied to print isolated resist lines, but such techniques are not effective in printing isolated trenches. Because of diffraction characteristics related to the mask geometry, the printing of trenches is much more difficult than printing lines. In conventional technology, the mask pattern for etching an isolated line is an opaque line surrounded by a clear field. In contrast, the mask pattern for etching an isolated trench is a clear line surrounded by an opaque field. The diffraction patterns associated with such a trench mask pattern make it difficult to resolve the trench pattern with optical lithography at small feature sizes.

FIGS. 2A-4 schematically illustrate methods, in accordance with various embodiments, to overcome the shortcomings of the prior art processes, as described above, in the fabrication of semiconductor integrated circuits. FIGS. 2A and 2B illustrate an embodiment in which a required pattern of closely spaced trenches 20 is to be etched into a process layer. The trench pattern is a pattern that is determined in accordance with the IC being implemented. In this exemplary embodiment, the pattern is the same as pattern 20 described in accordance with FIG. 1. Pattern 20 includes three trenches 22, 24, and 26, although problematic patterns could include any odd numbers of trenches. Processing problems occur when the trenches to be etched into an underlying process layer have a width less than about 40 nm and/or a spacing of less than about 40 nm so that the pitch is less than about 80 nm. In such a case, with the three-trench pattern 20 illustrated, in accordance with one embodiment, the pattern is decomposed into two patterns 38 and 40. Pattern 38 includes two trenches 22 and 26, each having a width of less than about 40 nm and a trench-to-trench spacing of greater than 40 nm. For example, if the trench width and pitch of pattern 20 are 32 nm and 64 nm, respectively, the trench width and pitch of pattern 38 are about 32 nm and 128 nm, respectively. Similarly, if the trench width and pitch of pattern 20 are 40 nm and 80 nm, respectively, the trench width and pitch of pattern 38 are about 40 nm and 160 nm, respectively.

A pattern such as pattern 38, having a plurality of trenches with a trench-to-trench spacing greater than 40 nm, can be reliably printed with state-of-the-art photolithographic equipment.

Pattern 40 includes trench 24, but, in accordance with an embodiment, also includes two density balancer patterns 42 and 44 symmetrically positioned on either side of trench 24. Trench 24, by itself, is a lithographically unprintable feature (with standard state-of-the-art lithographic technology such as the 193i technology) because it is narrow and isolated. The use of symmetric density balancer patterns provides good image contrast and improves lithographic print capability so that trench 24, in combination with the density balancer patterns, becomes a lithographically printable feature. The density balancer patterns 42 and 44 can be, for example, substantially the same length and width as trench 24. The spacing between trench 24 and density balancer patterns 42 and 44 can be about the same as the spacing between trenches 22 and 26 in pattern 38. Accordingly, trench 24 and density balancer patterns 42, and 44 can have widths of about 40 nm or less and a pitch of about 160 nm or less, but at least a spacing greater than 40 nm. As an example, if the trench width and pitch of pattern 20 are 32 nm and 64 nm, respectively, the width and pitch of pattern 40 are about 32 nm and 128 nm, respectively.

After decomposing pattern 20 into two patterns 38 and 40, two masks are generated. The first mask implements pattern 38 and the second mask implements pattern 40 including isolated trench 24 and density balancer patterns 42 and 44 symmetrically positioned with respect to isolated trench 24. A first photoresist layer is applied overlying the process layer and is patterned using the first mask. The first photoresist layer is exposed to radiation that passes through the first mask and is developed to provide a patterned resist layer. The patterned resist layer is used as an etch mask to etch the underlying process layer to produce a trench pattern in the process layer that replicates pattern 38. The first photoresist layer is then removed and a second photoresist layer is applied overlying the process layer. The second photoresist layer is exposed to radiation that passes through the second mask and is developed to provide a photoresist layer that is patterned with pattern 40. The second patterned resist layer is used as an etch mask to etch the underlying process layer to produce a trench pattern in the process layer that replicates pattern 40. Because of the presence of the density balancer patterns 42 and 44, good image contrast is achieved and isolated trench 24 is able to be printed reliably. The combination of the pattern etched using the first mask and the pattern etched using the second mask results in a pattern 46, as illustrated at the right hand side of FIG. 2, etched into the process layer. Pattern 46 includes the three trenches included in pattern 20 in addition to the two density balancer patterns 42 and 44. The density balancer patterns are not electrically connected to the IC and remain on the circuit as dummy features in the same manner that dummy features are used, for example, insure uniform chemical mechanical planarization (CMP) across an integrated circuit chip.

Figure 4:
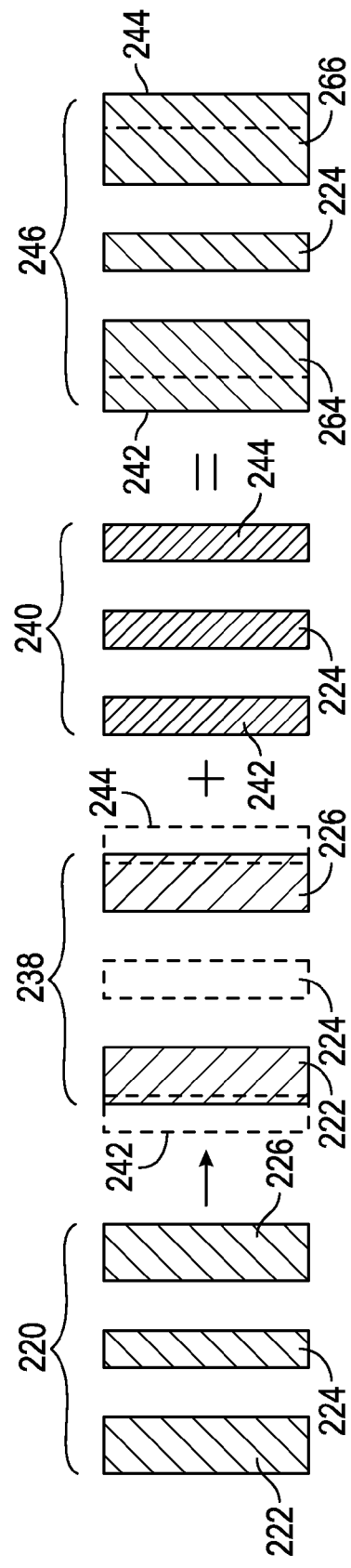

FIGS. 3 and 4 schematically illustrate additional methods, in accordance with alternative embodiments, for etching trenches into a process layer during the fabrication of semiconductor integrated circuits that overcome the problems associated with prior art processes. FIG. 3 illustrates a pattern of trenches 120, determined to be required for the IC that is being fabricated, that is to be etched into a process layer. Pattern of trenches 120 includes three trenches 122, 124, and 126. Trench 124 is narrow and closely spaced with respect to trenches 122 and 126. The width of trench 124 is less than or equal to about 40 nm and the spacing between trench 124 and trench 122 and/or 126 is less than or equal to about 40 nm. Trenches 122 and 126 are wider than trench 124. Such a pattern cannot be reliably printed with conventional lithographic techniques. In accordance with one embodiment, pattern 120 is decomposed into two patterns 138 and 140 and a process of litho-etch, litho-etch, as described above, is applied. Pattern 138 includes trenches 122 and 126 spaced apart by a distance much greater than 40 nm. The width and spacing of trenches 122 and 126 are such that pattern 138 is lithographically printable; that is, the pattern can be reliably etched into the underlying process layer using state-of-the-art lithographic equipment.

Pattern 140 includes isolated trench 124 and, in accordance with an embodiment, two density balancer patterns 142 and 144. Isolated trench 124, by itself, is lithographically unprintable using state-of-the-art lithographic technology. The density balance patterns are symmetrically positioned on either side of trench 124. The spacing between trench 124 and either 142 or 144 is greater than 40 nm, and is conveniently chosen to be the maximum spacing that allows balancer patterns 142 and 144 to overlap patterns 122 and 126. By overlapping patterns 122 and 126 in this manner, no additional spacing is needed in fabricating the IC. Such positioning of density balancer patterns 142 and 144 (along with trench 124) is indicated by the dashed patterns overlaying pattern 138. The use of density balancer patterns provides good image contrast and improves lithographic print capability and causes isolated trench 124, with the addition of density balancer patterns 142 and 144, to be lithographically printable. Density balancer patterns 142 and 144 can be, for example, substantially the same length and width as trench 124. After decomposing pattern 120 into two patterns 138 and 140, two masks are generated. The first mask implements pattern 138 and the second mask implements pattern 140 including isolated trench 124 and density balancer patterns 142 and 144. The two masks are employed in a litho-etch, litho-etch process as described above to etch a trench pattern 146 in the process layer. Trench pattern 146 includes trenches 122, 124, 126 as required for the IC being fabricated.

FIG. 4 schematically illustrates a pattern of trenches 220, determined to be required for the IC that is being fabricated, that is to be etched into a process layer. Pattern of trenches 220 includes three trenches 222, 224, and 226. Trench 224 is narrow and closely spaced with respect to trenches 222 and 226. The width of trench 224 is less than or equal to about 40 nm and the spacing between trench 224 and trench 222 and/or 226 is less than or equal to about 40 nm. Trenches 222 and 226 are wider than trench 224, but not necessarily as wide as trenches 122 and 126 illustrated in FIG. 3. Such a pattern cannot be printed reliably with conventional lithographic techniques. In accordance with one embodiment, pattern 220 is decomposed into two patterns 238 and 240 and a process of litho-etch, litho-etch, as described above, is applied. Pattern 238 includes trenches 222 and 226 spaced apart by a distance much greater than 40 nm. The spacing of trenches 222 and 226 is such that pattern 238 is lithographically printable and can be reliably etched into the underlying process layer using state-of-the-art lithographic equipment.

Pattern 240 includes isolated trench 224 and, in accordance with an embodiment, two density balancer patterns 242 and 244. By itself, isolated trench 224 is not lithographically printable with state-of-the-art lithographic technology. The density balance patterns are symmetrically positioned on either side of trench 224. The spacing between trench 224 and either density balancer pattern 242 or density balancer pattern 244 is greater than 40 nm, and is conveniently chosen to be a spacing that allows balancer patterns 242 and 244 to at least partially overlap patterns 222 and 226. Such positioning of density balancer patterns 242 and 244 (along with trench 224) is indicated by the dashed patterns overlaying pattern 238. The use of density balancer patterns provides good image contrast, improves lithographic print capability, and causes isolated trench 224 to be lithographically printable. Density balancer patterns 242 and 244 can be, for example, substantially the same length and width as trench 224. By positioning density balancer patterns 242 and 244 to at least partially overlap trench patterns 222 and 226, the additional space used by the density balancer patterns on the semiconductor substrate is minimized. After decomposing pattern 220 into two patterns 238 and 240, two masks are generated. The first mask implements pattern 238 and the second mask implements pattern 240 including isolated trench 224 and density balancer patterns 242 and 244. The two masks are employed in a litho-etch, litho-etch process as described above to etch a trench pattern 246 in the process layer. Trench pattern 246 includes trenches 224 and two additional trenches 264 and 266 that are enlarged trenches corresponding to originally determined trenches 222, 226, respectively, as required for the IC being fabricated.

In accordance with one embodiment, the photoresist layers described above are exposed using deep ultra violet (deep UV) radiation that passes through the lithographic masks that carry the decomposed patterns. In accordance with another embodiment, the exposed photoresist layers described above are developed with a negative tone developer which has proved advantageous for developing narrow openings. The negative tone developer process differs from the positive tone developer process because deprotected (that is, exposed) resist polymer is used as the etch block in negative tone, versus unexposed resist for positive tone. The negative tone developer process provides critical dimension uniformity and better pattern fidelity. At small feature size and smaller printer variation budget, the negative tone developer process provides a better printing solution to layers with narrow trenches or arrays of contact holes.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the disclosure in any way. Rather, the foregoing detailed description will provide those skilled in the art with a convenient road map for implementing the exemplary embodiments. It should be understood that various changes can be made in the function and arrangement of elements without departing from the scope of the disclosure as set forth in the appended claims and the legal equivalents thereof.

What is claimed is:

1. A method for fabricating a semiconductor integrated circuit comprising:
  providing a semiconductor substrate with an overlying process layer;
  determining a required trench pattern to be etched into the process layer, wherein the required trench pattern comprises three or more trenches;
  decomposing the required trench pattern into a first pattern and a second pattern, the second pattern including an isolated trench positioned between trenches of the first pattern and further including a plurality of density balancer patterns symmetrically positioned with respect to the isolated trench, wherein the isolated trench is a portion of the required trench pattern and the plurality of density balancer patterns correspond to a plurality of dummy features different than the required trench pattern;
  generating a first lithographic mask implementing the first pattern and a second lithographic mask implementing the second pattern including the isolated trench and the density balancer patterns;
  patterning a first resist layer overlying the process layer with the first lithographic mask and etching the process layer with the patterned first resist layer as an etch mask; and
  patterning a second resist layer overlying the process layer with the second lithographic mask and etching the process layer with the patterned second resist layer as an etch mask to implement the isolated trench of the required trench pattern in the process layer, wherein the plurality of dummy features are produced in the process layer from the plurality of density balancer patterns.

2. The method of claim 1 wherein determining a trench pattern comprises determining a trench pattern comprising three trenches, at least one of which has a width less than or equal to about 40 nm and which is spaced from the other two of the three trenches by a space less than or equal to about 40 nm.

3. The method of claim 1 wherein decomposing the required trench pattern into a second pattern comprises positioning first and second density balancer patterns in spaced apart relationship to the isolated trench, the density balancer patterns spaced apart from the isolated trench by a distance greater than about 40 nm.

4. The method of claim 3 wherein positioning first and second density balancer patterns comprises positioning first and second density balancer patterns each having a length and width substantially equal to the length and width of the isolated trench.

5. The method of claim 1 wherein patterning the second resist layer comprises exposing the second resist layer to deep ultra violet radiation passing through the second lithographic mask.

6. The method of claim 1 wherein patterning the second resist layer comprises developing the second resist layer with a negative tone developer.

7. The method of claim 1 wherein etching the process layer with the patterned second resist layer as an etch mask comprises etching the plurality of density balancer patterns into the process layer as dummy patterns, wherein the dummy patterns are separate from the required trench pattern.

8. The method of claim 1 wherein decomposing the required trench pattern into a second pattern comprises positioning first and second density balancer patterns in spaced apart relationship to the isolated trench and at least partially overlapping the first pattern.

9. A method for fabricating a semiconductor integrated circuit comprising:
  providing a semiconductor substrate with an overlying process layer;
  determining a trench pattern to be etched into the process layer, the trench pattern including an isolated trench;
  forming a lithographic mask implementing the trench pattern and further including first and second density balancer patterns symmetrically positioned with respect to the isolated trench, wherein the first and second density balancer patterns correspond to dummy features;
  applying a resist layer overlying the process layer;
  patterning the resist layer with the lithographic mask; and
  etching the process layer using the patterned resist layer as an etch mask, wherein etching the process layer comprises etching the dummy features.

10. The method of claim 9 wherein forming a lithographic mask comprises positioning the first and second density balancer patterns at a distance greater than or equal to about 40 nm from the isolated trench.

11. The method of claim 9 wherein patterning the resist layer comprises:
  exposing the resist layer to radiation passing through the lithographic mask; and
  developing the resist with a negative tone developer.

12. The method of claim 9 wherein forming a lithographic mask comprises forming a lithographic mask wherein the isolated trench has a length and a width and wherein the first and second density developer patterns have a length and width substantially the same as the isolated trench.

13. The method of claim 12 wherein forming a lithographic mask comprises forming a lithographic mask having an isolated trench with a width less than about 40 nm.

14. A method for fabricating a semiconductor integrated circuit comprising:
  providing a process layer overlying a semiconductor substrate;
  determining a trench pattern to be etched into the process layer as required for the semiconductor integrated circuit being fabricated;
  decomposing the trench pattern into a first pattern of lithographically printable features and a second pattern of lithographically unprintable features including an isolated trench, wherein the isolated trench is positioned between lithographically printable features of the first pattern;
  converting the lithographically unprintable features to lithographically printable features by adding density balancer patterns to the second pattern in spaced apart symmetric relationship to the isolated trench to form a converted second pattern, wherein the density balancer patterns correspond to dummy features; and
  etching the first pattern and the converted second pattern into the process layer, wherein etching the converted second pattern comprises etching the dummy features into the process layer.

15. The method of claim 14 further comprising:
  forming a first mask implementing the first pattern; and
  forming a second mask implementing the converted second pattern.

16. The method of claim 15 wherein etching the first pattern and the converted second pattern comprises using a first litho-etch process to etch the first pattern into the process layer and a second litho-etch process to etch the second pattern into the process layer.

17. The method of claim 16 wherein using a second litho-etch process comprises:
- applying a layer of resist material overlying the process layer;
- selectively exposing the layer of resist material to radiation passing through the second mask;
- developing the layer of selectively exposed resist material with a negative tone developer; and
- etching the process layer using the developed layer of resist material as an etch mask.

* * * * *